(12) United States Patent
Tateyama

(10) Patent No.: US 6,377,081 B1
(45) Date of Patent: Apr. 23, 2002

(54) PHASE DETECTION CIRCUIT

(75) Inventor: Tetsuo Tateyama, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/721,081

(22) Filed: Nov. 22, 2000

(30) Foreign Application Priority Data

Nov. 25, 1999 (JP) ............................................. 11-334951

(51) Int. Cl.[7] .............................................. G01R 25/00
(52) U.S. Cl. ............................................. 327/12; 327/7
(58) Field of Search ............................. 327/1–12, 147, 327/156

(56) References Cited

U.S. PATENT DOCUMENTS 5,015,970 A * 5/1991 Williams et al. ............... 331/11
6,034,554 A * 3/2000 Francis et al. .................. 324/7

FOREIGN PATENT DOCUMENTS

| JP | 63-60650 | 3/1988 |
| JP | 7-131448 | 5/1995 |
| JP | 11-112335 | 4/1999 |

* cited by examiner

Primary Examiner—Toan Tran
Assistant Examiner—Cassandra Cox
(74) Attorney, Agent, or Firm—Ostrolenk, Faber, Gerb & Soffen, LLP

(57) ABSTRACT

The detection circuit comprising: a first D-type flip-flop circuit F/F1, to which the data signal D1 and the clock signal C1 are input; a first delay circuit DL2 which delays the clock signal C1 by a prescribed amount of time, so as to generate a delayed clock signal C1'; a second D-type flip-flop circuit F/F2, to which the output signal Q1 of the first D-type flip-flop circuit F/F1 and the delayed clock signal C1' are input; a second delay circuit DL1 which delays the an output signal Q2 of the second D-type flip-flop circuit F/F2 so as to generate a first delayed signal Q2', a third delay circuit DL3 which delay the an output signal Q1 of the first D-type flip-flop circuit F/F1 so as to generate a second delayed signal Q1', a fourth delay circuit DL4 which delays the data signal D1 so as to generate a delayed data signal D1', a first AND circuit AND2 which calculates a logical product of the first delayed signal Q2' and the second delayed signal Q1' so as to output a DOWN signal, a second AND circuit AND1 which calculates a logical product of the second delayed signal Q1' and the delayed data signal D1' so as to output an UP signal, and an adder circuit ADD which adds the UP signal and the DOWN signal so as to output a detection signal PDOUT detecting the phase difference between the data signal D1 and the clock signal C1.

6 Claims, 9 Drawing Sheets

PHASE DETECTION CIRCUIT

BACKGROUND OF THE INVENTION

1. Field of the Invention

The invention relates to a phase detection circuit for the purpose of generating a local clock in accordance with the phase difference between two clock signals.

2. Related Art

In the past, to a phase detection circuit, for example, a signal comprising a random binary-coded stream generated by a clock of frequency f0, inputted and the phase detection circuit was used to generate a local clock with both a phase and a frequency synchronized to this clock signal.

For example, the first example of a phase detection circuit according to prior art, shown in FIG. 9, is formed by D-type flip-flops F/F1, F/F2, AND circuits AND1 and AND2, an adder circuit ADD, and a delay circuit DL1. In a phase detection circuit configured in this manner, a first clock signal C1 and a data signal D1 are input, and output signals PDOUT and Q2 are output.

With a phase detection circuit having the configuration of the first example of prior art, the timing of the clock C1 input to the flip-flops F/F1 and F/F2 is the same. Thus, the timing of the signal Q1 input to the flip-flop F/F2 is delayed by a prescribed delay time tpd1.

In the above-noted phase detection circuit of the past, however, there was a need for a further increase in speed. With respect to this need, with the above-noted configuration of the past, the high the signal speed becomes, the more significant becomes the delay time tpd1 of the flip-flop F/F1, thereby reducing the operation margin of the flip-flop F/F2. For this reason, depending upon the operating conditions and variations in the manufacturing conditions of the circuit, if the delay time tpd1 changes, there is a further reduction in the operating margin, thereby leading to the problem of faulty operation.

For example, in the case of a 10-Gb/s NRZ signal, with a clock period T of 100 ps, the delay time tpd1 is approximately 20 to 40 ps, and when the variations in various conditions are considered, the delay time tpd1 becomes approximately 60 ps.

Accordingly, it is an object of the present invention to provide a phase detection circuit that enables the achievement of a sufficient operating margin.

SUMMARY OF THE INVENTION

In order to achieve the above noted objects, the present invention adopts the following basic technical constitution.

Specifically, the first aspect of the present invention is a phase detection circuit which detects a phase difference between a data signal D1 and a clock signal C1, the detection circuit comprising: a first D-type flip-flop circuit F/F1, to which the data signal D1 and the clock signal C1 are input; a first delay circuit DL2 which delays the clock signal C1 by a prescribed amount of time, so as to generate a delayed clock signal C1'; a second D-type flip-flop circuit F/F2, to which an output signal Q1 of the first D-type flip-flop circuit F/F1 and the delayed clock signal C1' are input; a second delay circuit DL1 which delays the output signal Q2 of the second D-type flip-flop circuit F/F2 so as to generate a first delayed signal Q2', a third delay circuit DL3 which delay the an output signal Q1 of the first D-type flip-flop circuit F/F1 so as to generate a second delayed signal Q1', a fourth delay circuit DL4 which delays the data signal D1 so as to generate a delayed data signal D1', a first AND circuit AND2 which calculates a logical product of the first delayed signal Q2' and the second delayed signal Q1' so as to output a DOWN signal, a second AND circuit AND1 which calculates a logical product of the second delayed signal Q1' and the delayed data signal D1' so as to output an UP signal, and an adder circuit ADD which adds the UP signal and the DOWN signal so as to output a detection signal PDOUT detecting the phase difference between the data signal D1 and the clock signal C1.

In the second aspect of the present invention, the first D-type flip-flop circuit F/F1 operates at rising edge of the clock signal C1 and the second D-type flip-flop circuit F/F2 operates at a falling edge of the delayed clock signal C1'.

In the third aspect of the present invention, to the first AND circuit, the second delayed signal and an inverted signal of the first delayed signal are input, and to the second AND circuit, the delayed data signal and an inverted signal of the second delayed signal are input The fourth aspect of the present invention is a phase detection circuit which detects a phase difference between a data signal D1 and a clock signal C1, the detection circuit comprising: a first D-type flip-flop circuit F/F1, to which the data signal D1 and the clock signal C1 are input; a first delay circuit DL12 which delays the clock signal C1 by a prescribed amount of time, so as to generate a delayed clock signal C1'; a second D-type flip-flop circuit F/F2, to which an output signal Q1 of the first D-type flip-flop circuit F/F1 and the delayed clock signal C1'are input; a second delay circuit DL13 which delays the an output signal Q1 of the first D-type flip-flop circuit F/F1 so as to generate a first delayed signal Q1', a third delay circuit DL11 which delays the data signal D1 so as to generate a second delayed signal D1', a first exclusive-OR circuit XOR2 which calculates a logical product of an output signal Q2 of the second D-type flip-flop circuit F/F2 and the first delayed signal Q1' so as to output a DOWN signal, a second exclusive-OR circuit XOR1 which calculates a logical product of the first delayed signal Q1' and the second delayed signal D1' so as to output an UP signal, and an adder circuit ADD which adds the UP signal and the DOWN signal so as to output a detection signal PDOUT detecting the phase difference between the data signal and the clock signal.

BRIEF DESCRIPTIONS OF THE DRAWINGS

DETAILED DESCRIPTION OF THE PREFERRED EMBODIMENTS

Embodiments of the present invention are described in detail below, with references made to relevant accompanying drawings.

(First Embodiment)

Figure 1:
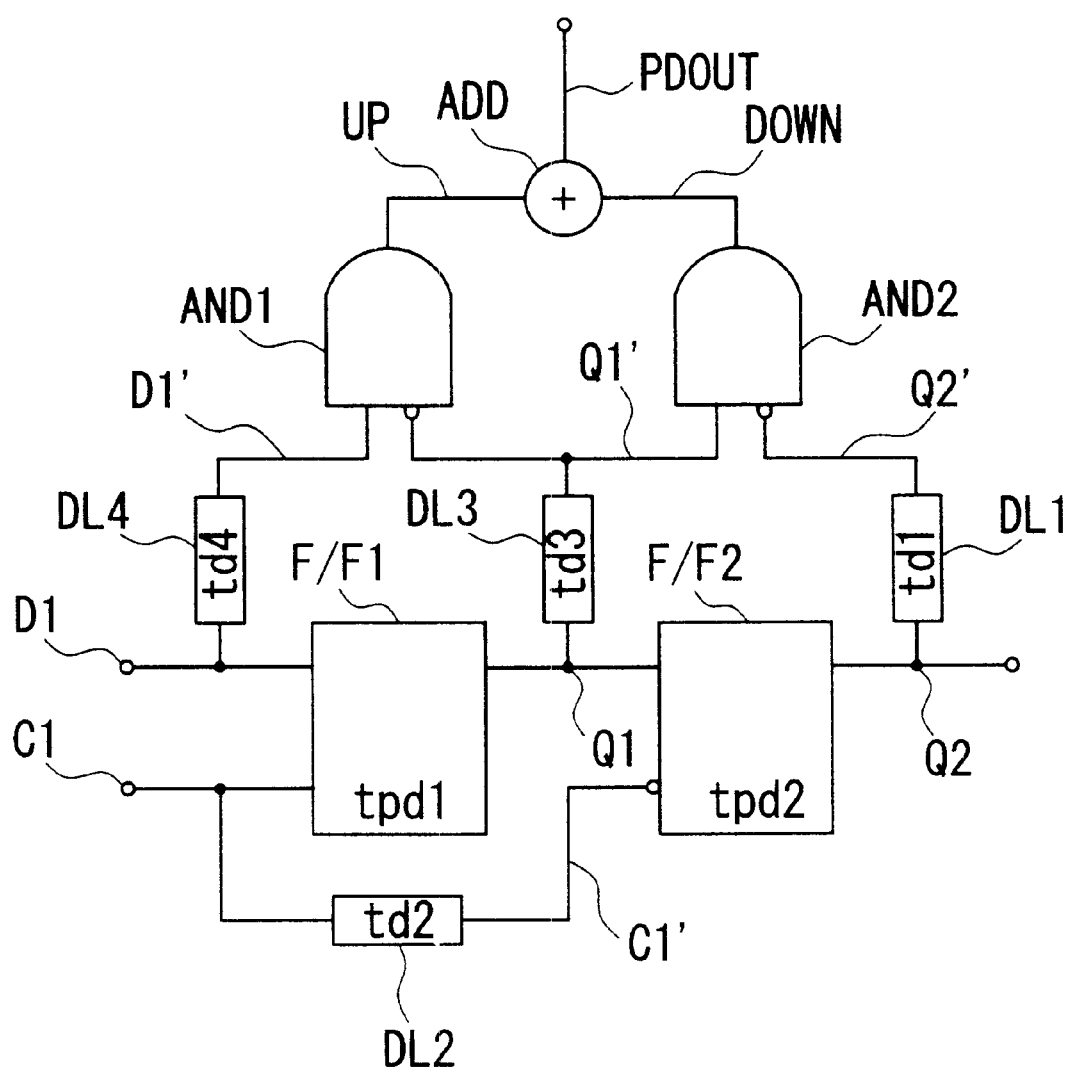
FIG. 1 is a logic circuit diagram showing a phase detection circuit according to a first embodiment of the present invention.

Specifically, FIG. 1 shows an example of the configuration of a phase detection circuit according to a first embodiment of the present invention, which is formed by D-type flip-flop circuits F/F1 and F/F2, AND circuits AND1 and AND2, an adder circuit ADD, and delay circuits DL1, DL2, DL3, and DL4.

In FIG. 1, the reference numeral D1', C1', Q1', and Q2' represent signals, signal D1' being input to the AND circuit AND1, signal C1' being input to the flip-flop F/F/2, signal Q1' being input to the AND circuits AND1 and AND2, and signal Q2' being input to the AND circuit AND2. Other reference numerals D1, C1, Q1, Q2, PDOUT represent a data signal, a clock signal of this circuit, an output signal of F/F1, an output signal of F/F2, and an output signal of the adder circuit ADD, respectively.

The first D-type flip-flop circuit F/F1 outputs the signal Q1, with the data signal D1 and the clock signal C1 input thereto. The second D-type flip-flop circuit F/F2 outputs the signal Q2, with the signal Q1 and the signal C1' input thereto.

The AND circuit AND1 and outputs the signal UP with a non-inverted signal D1' and an inverted signal Q1' input thereto, and the AND circuit AND2 outputs the signal DOWN with a non-inverted signal Q1' and an inverted signal Q2' input thereto.

The adder circuit ADD outputs the PDOUT signal (ternary signal) with the UP signal output from the AND circuit AND1 and the DOWN signal output from the AND circuit AND2 input thereto.

The delay circuit DL2 with input signal C1 outputs the signal C1', and the delay circuit DL1 with input signal Q2 outputs the signal Q2'. The delay circuit DL3 with input signal Q1 outputs the signal Q1', and the delay circuit DL4 with input signal D1 outputs the signal D1'.

The flip-flop circuit F/F1 operates on the rising edge of the signal C1 and the flip-flop circuit F/F2 operates on the falling edge of the signal C1'. The delay times of the flip-flop circuits F/F1 and F/F2 are tpd1 and tpd2, respectively, the delay times of the delay circuits DL1 to DL4 are td1 to td4, respectively.

The PDOUT signal is integrated by the integrator not shown in the drawing and the phase difference between a data signal D1 and a clock signal C1 is obtained.

In the first embodiment, it is desirable that delay time tpd1, tpd2 of the flip-flop circuits, td1, td2, td3, td4 of the delay circuits are same value.

The operation of the above-described phase detection circuit is as follows. The adder ADD of phase detection circuit of the present invention detects the phase difference between the signal D1 and the signal C1 by comparing the UP signal outputted from the AND circuit AND1 and the DOWN signal outputted from the AND circuit AND2, thereby outputs the PDOUT signal added by the adder ADD. This operation is described below, with reference to the timing diagram of FIG. 2 to FIG. 4.

Figure 2:
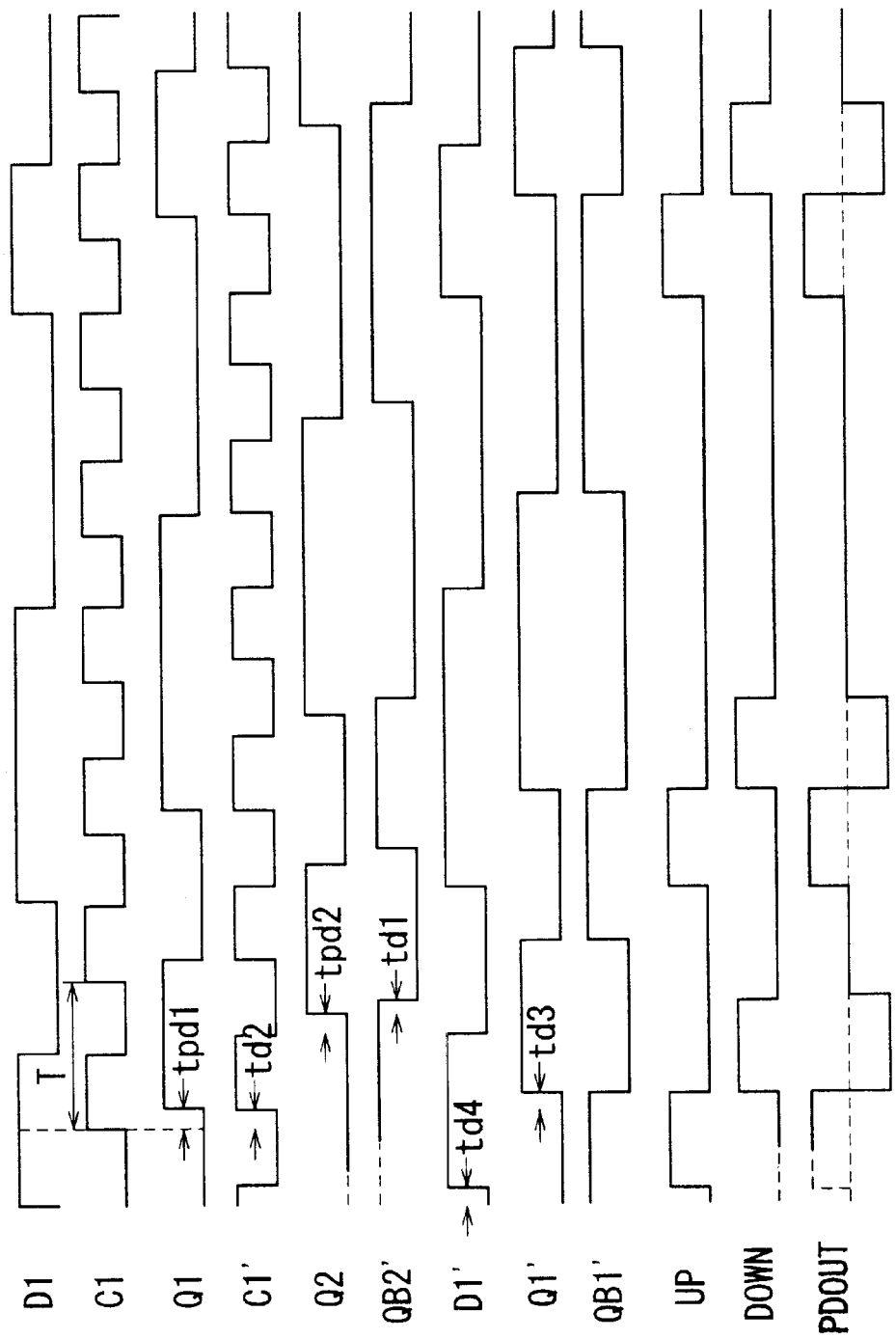
FIG. 2 is phase detection timing diagram with regard the first embodiment.
Figure 3:
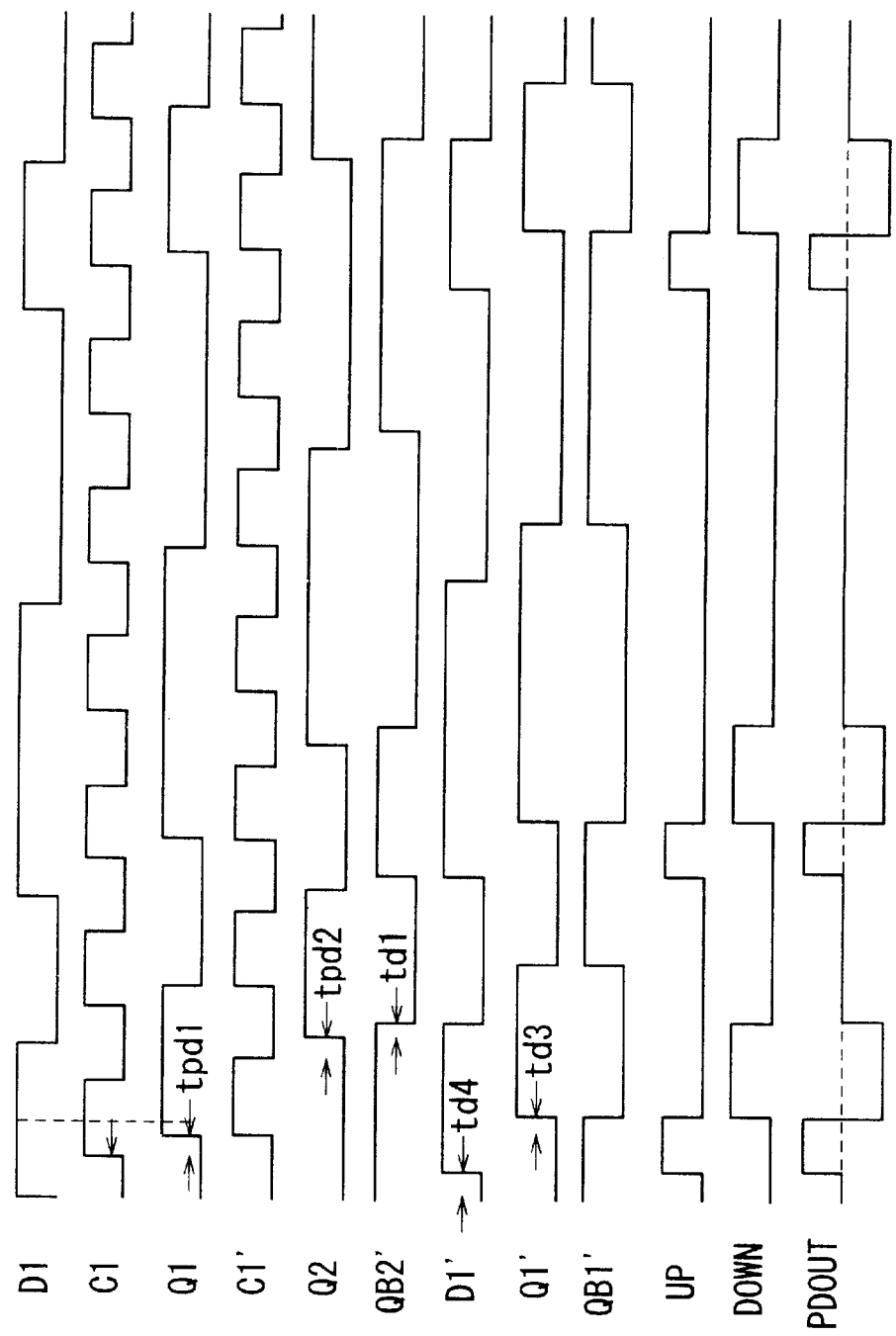
FIG. 3 is phase detection timing diagram with regard the first embodiment.
Figure 4:
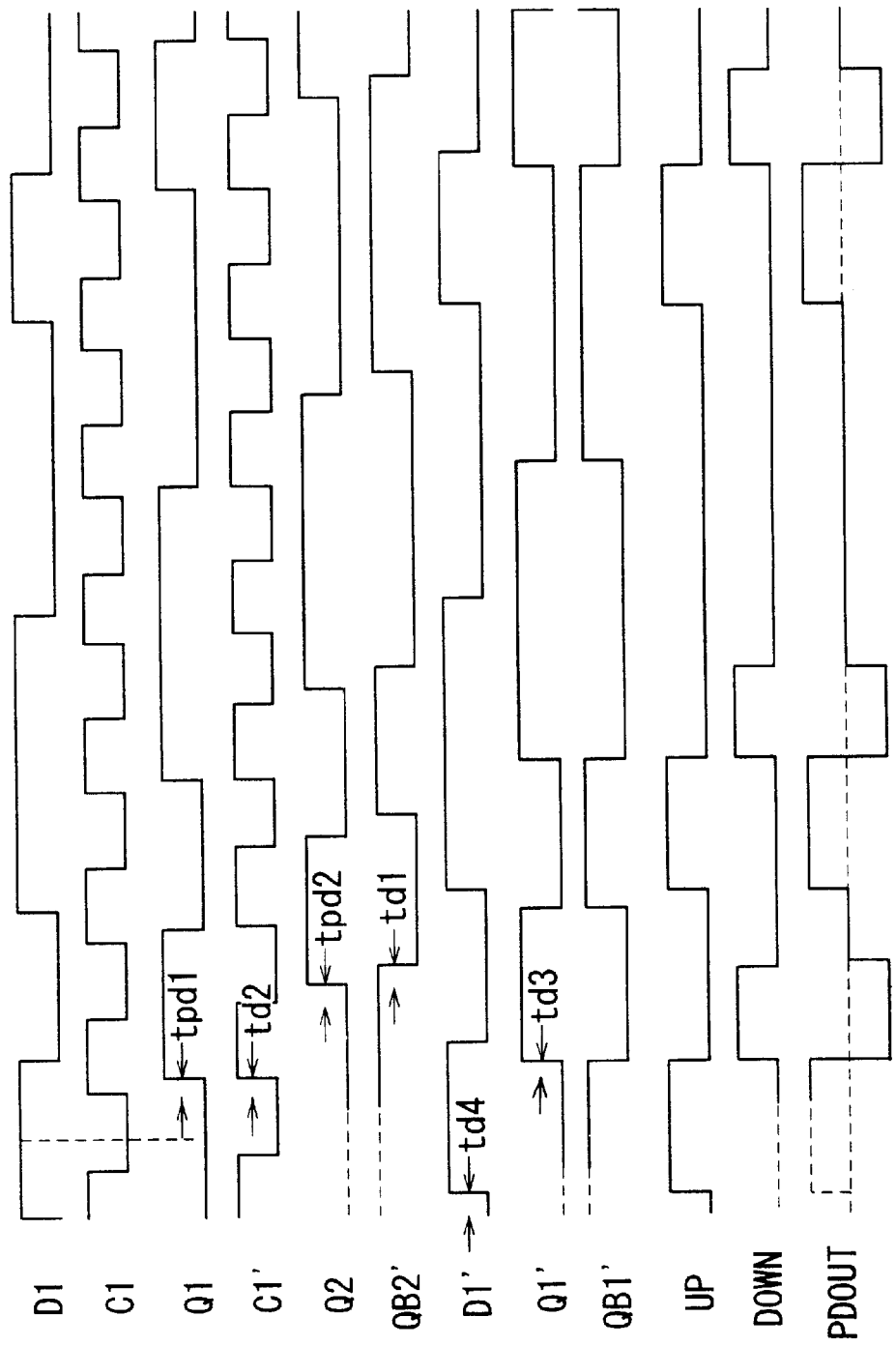
FIG. 4 is phase detection timing diagram with regard the first embodiment.

FIG. 2 illustrates the case in which phase difference between the signal D1 and the signal C1 is 0, that is, in the case in which the phases coincide with each other, FIG. 3 illustrates the case in which the phase of the signal C1 leads, and FIG. 4 illustrates the case in which the signal C1 lags.

The flip-flop circuit F/F1 latches the input data signal D1 at the rising edge of the signal C1 and outputs the signal Q1 with a time delay of (T/2+tpd1), having a clock period of T. The flip-flop circuit F/F2 latches the output signal Q1 of the flop-flop circuit F/F1 at the falling edge of the signal C1' and outputs the signal Q2 with a time delay of (T/2+tpd2), having a clock period of T.

The AND circuit AND1 calculates the logical product of the signal Q1' and the signal D1', which are delayed by times td3 and td4 by the delay circuits DL3 and DL4, respectively, and outputs the Up signal. The AND circuit AND2 calculates the logical product of the signal Q2' and the signal Q1', which are delayed by times td1 and td3 by the delay circuits DL1 and DL3, respectively, and outputs the DOWN signal. In the AND circuits AND1 and AND2, the inverted phase of the signals Q1' and Q2' is input thereto, respectively. However, in FIG. 2, FIG. 3 and FIG. 4, which illustrate the first embodiment, to simplify the description of this operation, the reference numerals QB1' and QB2' are used to indicate the respective inverted phase signals.

If the phases of the signal D1 and the signal C1 coincide with each other, the UP signal and the DOWN signal have the same pulse width (refer to FIG. 2). When the phase of the signal C1 leads than that of signal D1, the pulse with of the UP signal becomes smaller than the width of the DOWN signal (refer to FIG. 3). When the phases of the signal C1 lags than that of the signal D1, the pulse width of the UP signal becomes larger than the width of the DOWN signal (refer to FIG. 4).

The phase relationship between the signals Q1' and Q2' is such that there is a time spacing of T/2 at all times. For this reason, the output signal DOWN from the AND circuit AND2 having an input signal of these signals, regardless of the phase relationship between the signal D1 and the signal C1, has constantly a pulse width of T/2. Therefore, when the phase of the signal C1 leads that of the signal D1, the adder circuit ADD having input signals of the UP signal and the DOWN signal outputs a low level signal. When the phase of the signal C1 lags than that of the signal D1, the adder circuit ADD outputs a high level signal. When the phases of the signal D1 and the signal C1 coincide with each other, the adder circuit ADD outputs an intermediate level signal. As described above, the adder circuit ADD outputs the signal PDOUT in accordance with the phase difference between the signals D1 and C1.

According to the above-described embodiment, the condition of coincidence, phase lead, and phase lag between the input signal D1 and the input signal C1 is represented by the change of the duty cycle of the output signal PDOUT. Thus, the problem of a reduced operating margin with an increase in speed is solved by establishing a sufficiently large delay time tpd1.

(Second Embodiment)

Figure 5:
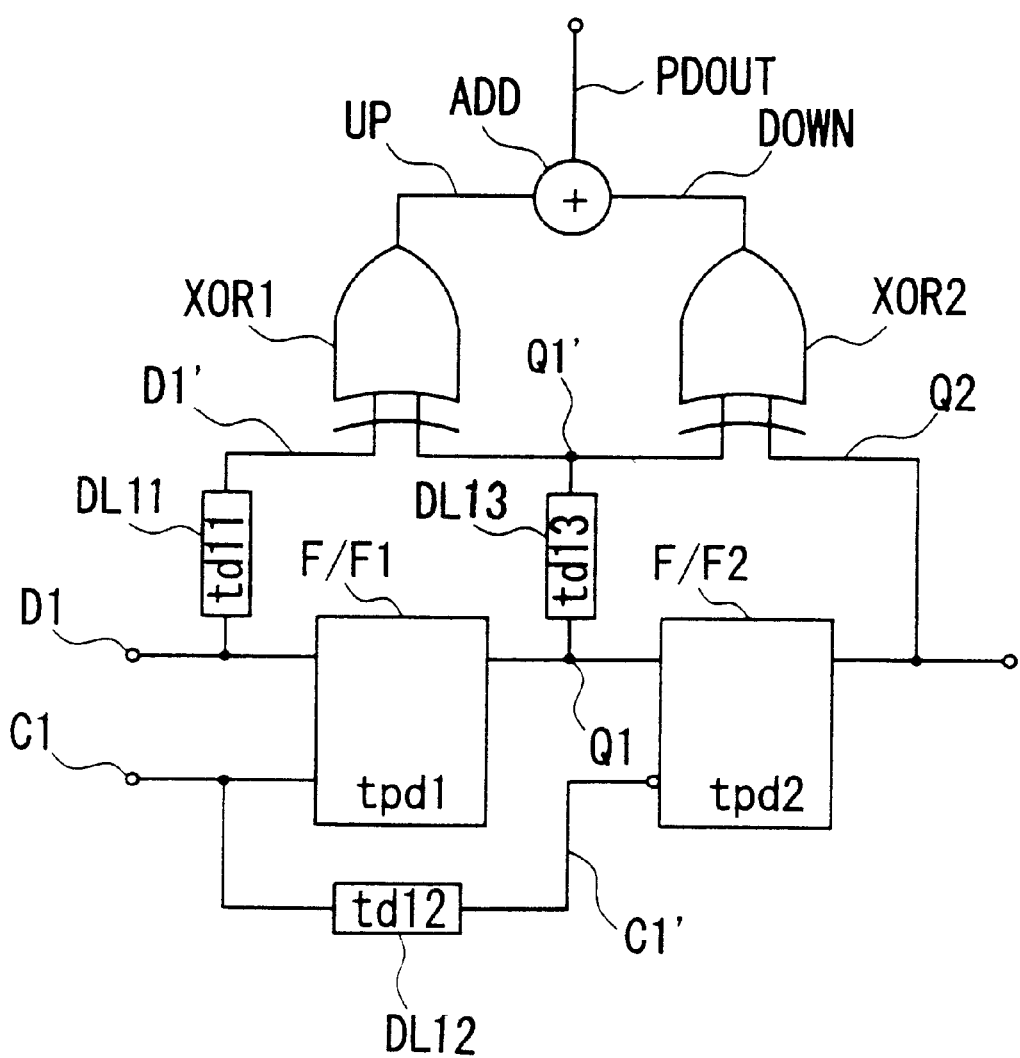
FIG. 5 is a logic circuit diagram showing a phase detection circuit according to a second embodiment of the present invention.

A second embodiment of the present invention is shown in FIG. 5, the configuration of which is based on that of the first embodiment, but with the AND circuit replaced by an XOR (exclusive-OR) circuit.

More specifically, the second embodiment of the present invention has a first D-type flip-flop circuit F/F1, to which the data signal D1 and the clock signal C1 are input, and which outputs the signal Q1, a second D-type flip-flop circuit F/F2, to which the signal Q1 and the signal C1' are input, and which outputs the signal Q2, an XOR circuit XOR1, to which the signal D1' and the signal Q1' are input, and which outputs the UP signal, an XOR circuit XOR2, to which the signal Q1' and the signal Q2 are input, and which outputs the DOWN signal, an adder circuit ADD, to which the UP and DOWN signals are input and outputs the PDOUT (ternary) signal, a delay circuit DL11, to which the signal D1 is input and outputs the signal D1', a delay circuit DL12, to which the signal C1 is input and outputs the signal C1', and a delay circuit DL13, to which the signal Q1 is input and outputs the signal Q1'.

In the phase detection circuit according to the second embodiment, the signal D1' is input to the XOR circuit XOR1, the signal C1'is input to the flip-flop F/F2, the signal Q1' is input to the XOR circuits XOR1 and XOR2, wherein the phase of the input signal C1' of the flip-flop F/F2 is the reverse phase to the phase of the signal C1. The delay times of the flip-flops F/F1 and F/F2 and tpd1 and tpd2, respectively, and the delay times of the delay circuits DL11 to DL13 are td11 to td13, respectively.

The operation of the above-noted phase detection circuit according to the second embodiment is as follows. This phase detection circuit detects the phase difference between the signal D1 and the signal C1 by comparing the UP signal of the XOR1 circuit and the DOWN signal of the XOR2 circuit, the results being output from the adder circuit ADD as the signal PDOUT. This operation is described below, with reference made to the timing diagrams of FIG. 6, FIG. 7, and FIG. 8.

Figure 6:
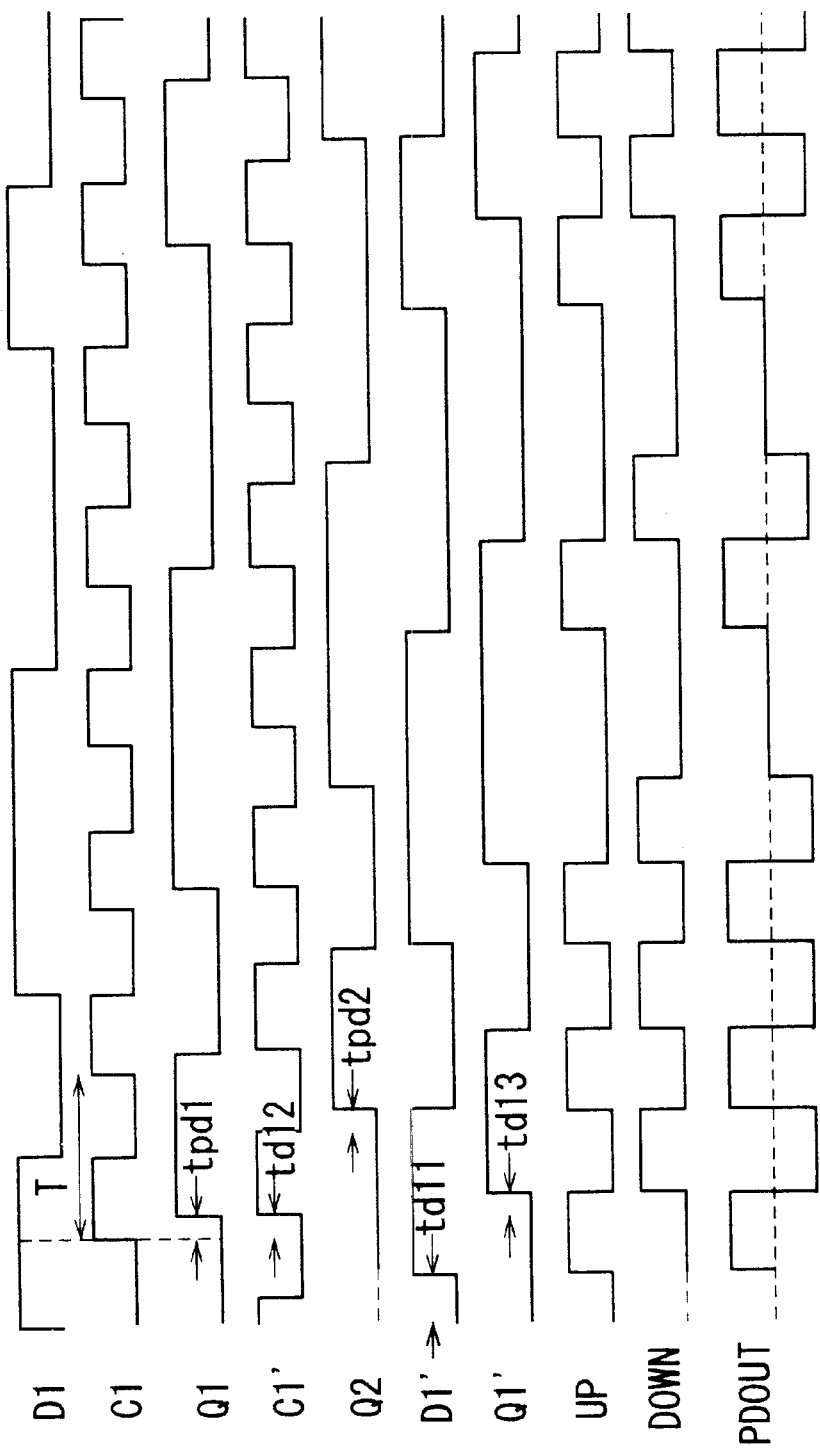
FIG. 6 is phase detection timing diagram with regard the second embodiment.
Figure 7:
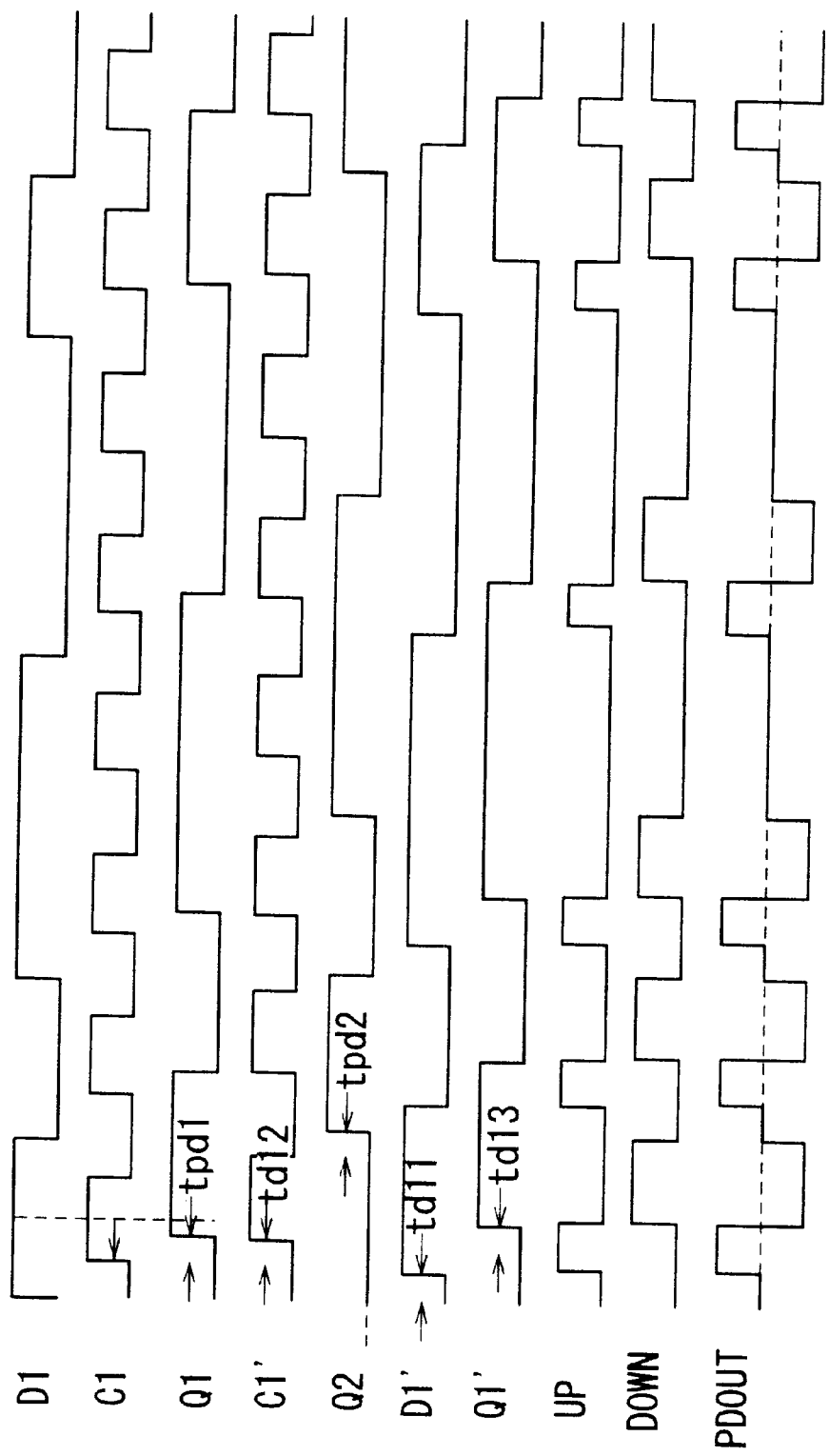
FIG. 7 is phase detection timing diagram with regard the second embodiment.
Figure 8:
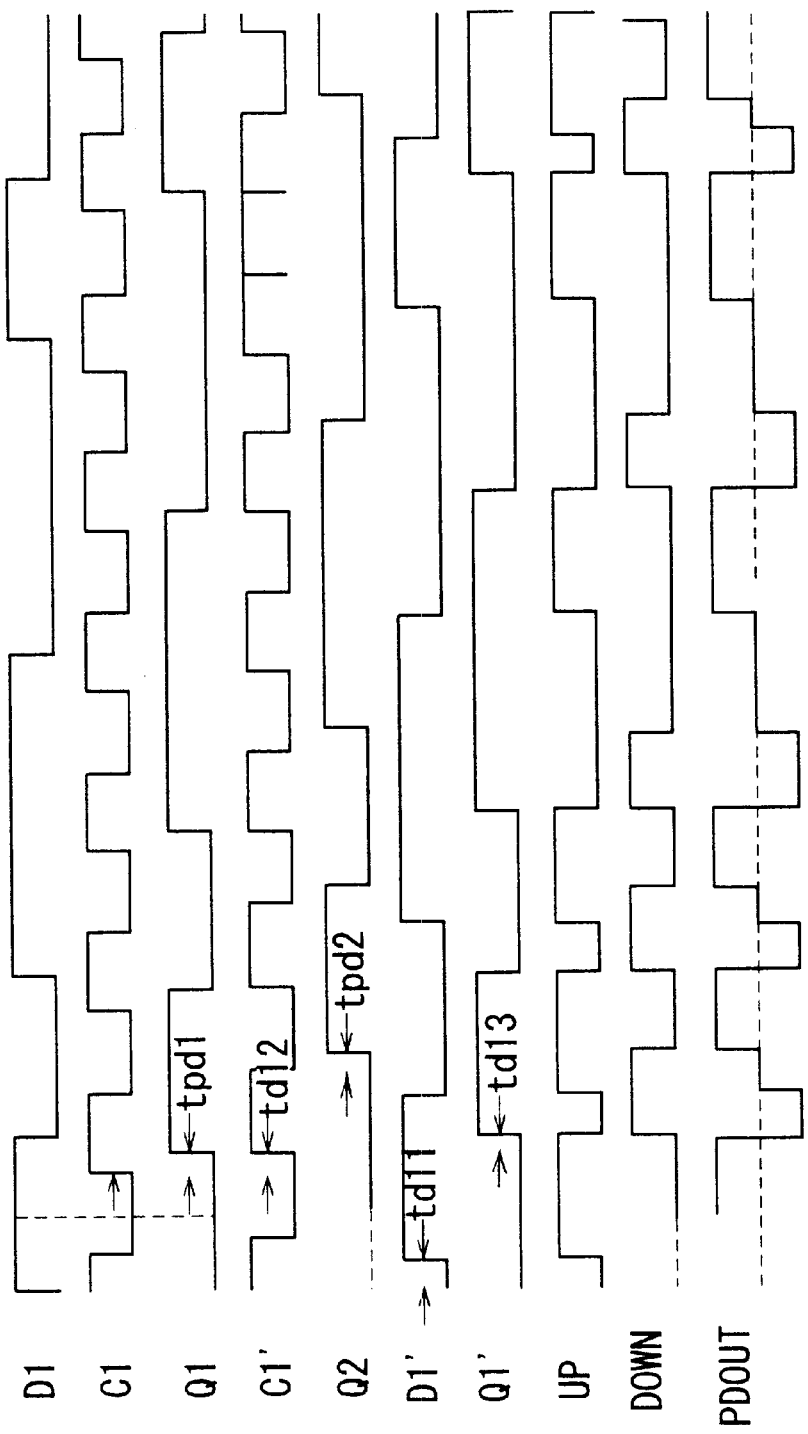
FIG. 8 is phase detection timing diagram with regard the second embodiment.
Figure 9:
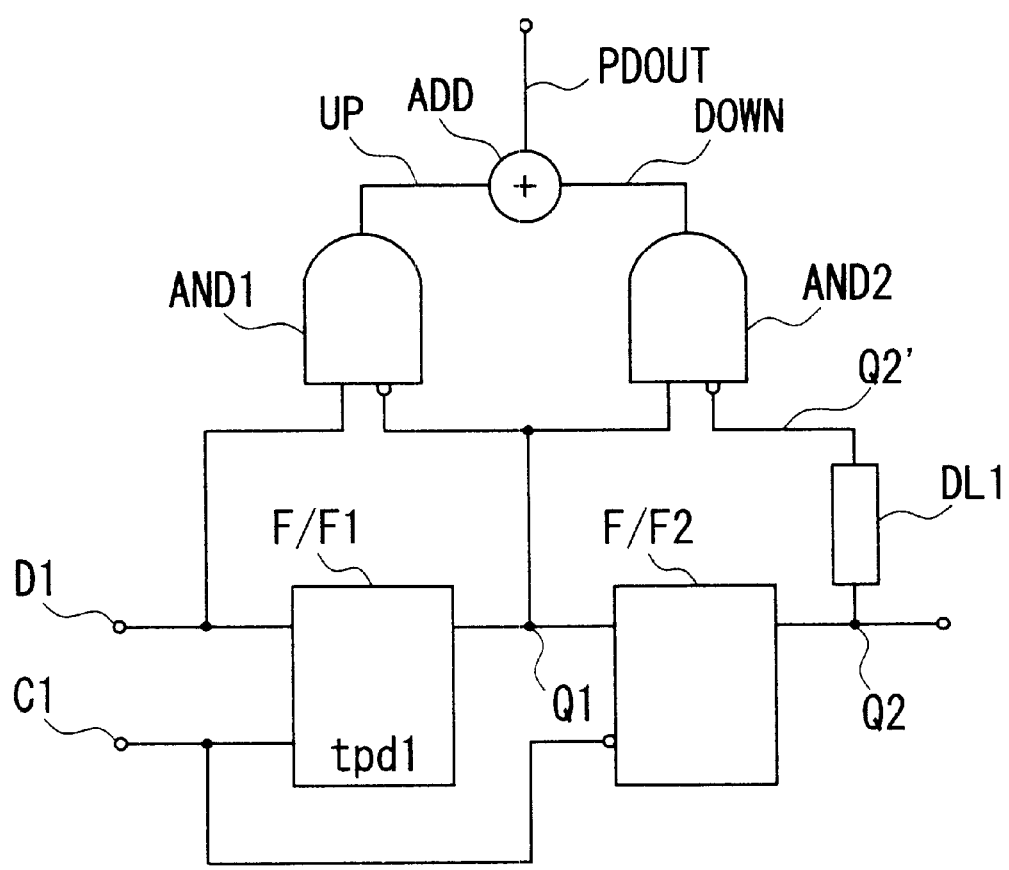
FIG. 9 is a logic circuit diagram showing a phase detection circuit of the first example of prior art.

FIG. 6 illustrates the case in which the phase difference between the signal D1 and the signal C1 is 0, that is, in the case in which the phases coincide with each other, FIG. 7 illustrates the case in which the phase of the signal C1 leads, and FIG. 8 illustrates the case in which the phase of the signal C1 lags.

The flip-flop circuit F/F1 latches the input data signal D1 at the rising edge of the signal C1, and outputs the signal Q1 having a time delay of (T/2+tpd1), with a clock period of T. The flip-flop circuit F/F2 latches the output signal Q1' of the flip-flop circuit F/F1 at falling edge of the signal C1, and outputs the signal Q2 with a time delay of (T/2+tpd2), with a clock period of T. The exclusive OR circuit XOR1 takes the exclusive OR of the signal D1' delayed td11 by the delay circuit DL11 and the signal Q1' delayed td13 by the delay circuit DL13, and outputs the UP signal, and the exclusive-OR circuit XOR2 takes the exclusive OR of the signal Q1' delayed td13 by the delay circuit DL13 and the output signal Q2 of the flip-flop circuit F/F2, and outputs the DOWN signal.

If the phases of the signal D1 and the signal C1 coincide with each other, the pulse width of the UP signal is T/2 (refer to FIG. 6). If the phase of the signal C1 leads the signal D1, the pulse width of the UP signal is smaller than T/2 (refer to FIG. 7), and If the phase of the signal C1 lags the signal D1, the pulse width of the UP signal is larger than T/2 (refer to FIG. 8).

The phase relationship between the signals Q1' and Q2' is such that there is a time interval of T/2 at all times. For this reason, the output signal DOWN from the exclusive-OR circuit XOR2 having input signals of these signals, regardless of the phase relationship between the signal D1 and the signal C1, has constantly a pulse width of T/2. Therefore, when the phase of the signal C1 leads that of the signal D1, the adder circuit ADD having input signals of the UP signal and the DOWN signal outputs a low level signal. When the phase of the signal C1 lags that of the signal D1, the adder circuit ADD outputs a high level signal. When the phases of the signal D1 and the signal C1 coincide with each other, the adder circuit ADD outputs a intermediate level signal. As described above, the adder circuit ADD outputs the signal PDOUT in accordance with the phase difference between the signals D1 and C1.

In the second embodiment, it is desirable that delay time tpd1, tpd2 of the flip-flop circuits, td11, td12, td13 of the delay circuits are same value.

According to the above-described embodiment, the clock input to the D-type flip-flop circuit F/F2 is delayed with respect to the clock input to the D-type flip-flop circuit F/F1. The delay time in this circuit configuration can be 10 picoseconds to several tens of picoseconds. For this reason, this can be established by the RC time constant of the signal wiring, thereby enabling a reduction in the size of the circuit and a reduction in the power consumed by the circuit.

The above described embodiments will be understood to be merely exemplary of the present invention, which do not restrict the present invention. It will be readily understood that other variations of the present invention can be made within the spirit of the present invention.

As is clear from the detailed description of the present invention presented above, in a phase detection circuit according to the present invention a data signal D1 and a clock signal C1 are input to a first D-type flip-flop circuit F/F1, the clock signal C1 being delayed by a delay circuit so as to generate a clock signal C1', this delayed clock C1' and the output signal Q1 of the first D type flip-flop circuit F/F1 being input to a second D type flip-flop circuit F/F2. The delay circuits DL4, DL3, and DL2 delay the data signal D1, the output signal Q1 of the first D-type flip-flop circuit F/F1, and the output signal Q2 of the second D-type flip-flop circuit F/F2, respectively, and two AND circuits are used to take the logical product of the delayed output signal D1' and Q1' and the logical product of the output signal Q1' and the output signal Q2', the output signals UP and DOWN from these AND circuits being added by the adder circuit AND, resulting in a PDOUT signal that detects the phase difference between the data signal D1 and the clock signal C1.

As described above, the problem of a reduction in the operating margin, which is aggravated by an increase in speed, is solved by making the delay time td2 of the signal C1' sufficiently large.

What is claimed is:

1. A phase detection circuit which detects a phase difference between a data signal and a clock signal, said detection circuit comprising:
   a first D-type flip-flop circuit, to which said data signal and said clock signal are input;
   a first delay circuit which delays said clock signal by a prescribed amount of time, so as to generate a delayed clock signal;
   a second D-type flip-flop circuit, to which an output signal of said first D-type flip-flop circuit and said delayed clock signal are input;
   a second delay circuit which delays said output signal of said second D-type flip-flop circuit so as to generate a first delayed signal;
   a third delay circuit which delay said an output signal of said first D-type flip-flop circuit so as to generate a second delayed signal;
   a fourth delay circuit which delays said data signal so as to generate a delayed data signal;
   a first AND circuit which calculates a logical product of said first delayed signal and said second delayed signal so as to output a DOWN signal;
   a second AND circuit which calculates a logical product of said second delayed signal and said delayed data signal so as to output and UP signal; and
   an adder circuit which adds said UP signal and said DOWN signal so as to output a detection signal detecting a phase difference between said data signal and said clock signal.

2. A phase detection circuit according to claim 1, wherein said first D-type flip-flop circuit operates at rising edge of said clock signal and said second D-type flip-flop circuit operates at a falling edge of said delayed clock signal.

3. A phase detection circuit according to claim 1, wherein to said first AND circuit, said second delayed signal and an inverted signal of said first delayed signal are input, and to said second AND circuit, said delayed data signal and an inverted signal of said second delayed signal are input.

4. A phase detection circuit which detects a phase difference between a date signal and a clock signal, said detection circuit comprising:

a first D-type flip-flop circuit, to which said data signal and said clock signal are input;

a first delay circuit which delays said clock signal by a prescribed amount of time, so as to generate a delayed clock signal;

a second D-type flip-flop circuit, to which an output signal of said first D type flip-flop circuit and said delayed clock signal are input;

a second delay circuit which delays said an output signal of said first D-type flip-flop circuit so as to generate a first delayed signal;

a third delay circuit which delays said data signal so as to generate a second delayed signal;

a first exclusive-OR circuit which calculates a logical product of an output signal of said second D-type flip-flop circuit and said first delayed signal so as to output a DOWN signal;

a second exclusive-OR circuit which calculates a logical product of said first delayed signal and said second delayed signal so as to output an UP signal; and an adder circuit which adds said UP signal and said DOWN signal so as to output a detection signal detecting said phase difference between said data signal and said clock signal.

5. A phase detection circuit according to claim 4, wherein said first D-type flip-flop circuit operates at rising edge of said clock signal and said second D-type flip-flop circuit operates at a falling edge of said delayed clock signal.

6. A phase detection circuit according to claim 4, wherein to said first exclusive-OR circuit, an output signal of said second D-type flip-flop circuit and said first delayed signal are input, and to said second exclusive-OR circuit, said first delayed signal and said second delayed signal are input.

* * * * *